(12) United States Patent
Hsu et al.

(10) Patent No.: US 12,142,539 B2
(45) Date of Patent: Nov. 12, 2024

(54) SEMICONDUCTOR STRUCTURE

(71) Applicant: Winbond Electronics Corp., Taichung (TW)

(72) Inventors: Ming-Chih Hsu, Taichung (TW); Chiung-Lin Hsu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/741,412

(22) Filed: May 10, 2022

(65) Prior Publication Data
US 2023/0369145 A1 Nov. 16, 2023

(51) Int. Cl.
*H01L 23/00* (2006.01)
*H01L 21/66* (2006.01)
*H10B 12/00* (2023.01)

(52) U.S. Cl.
CPC ............ *H01L 22/34* (2013.01); *H01L 23/562* (2013.01); *H10B 12/0335* (2023.02); *H10B 12/315* (2023.02); *H10B 12/482* (2023.02); *H10B 12/485* (2023.02)

(58) Field of Classification Search
CPC ... H01L 22/34; H01L 23/562; H10B 12/0335; H10B 12/315; H10B 12/482; H10B 12/485
See application file for complete search history.

(56) References Cited

U.S. PATENT DOCUMENTS

| | | | |
|---|---|---|---|
| 2010/0148314 A1* | 6/2010 | Han | H01L 22/34 257/E21.546 |
| 2017/0148748 A1* | 5/2017 | Jeong | H10B 41/35 |
| 2019/0035743 A1* | 1/2019 | Chang | H01L 23/544 |
| 2020/0058543 A1* | 2/2020 | Han | H01L 21/76802 |
| 2020/0194437 A1 | 6/2020 | Song et al. | |

FOREIGN PATENT DOCUMENTS

| | | |
|---|---|---|
| CN | 109309020 | 2/2019 |
| CN | 112436007 | 3/2021 |
| CN | 114078854 | 2/2022 |
| CN | 114078855 | 2/2022 |
| TW | I389261 | 3/2013 |

OTHER PUBLICATIONS

"Office Action of Taiwan Counterpart Application", issued on Feb. 18, 2023, p. 1-p. 8.

* cited by examiner

*Primary Examiner* — Shouxiang Hu
(74) *Attorney, Agent, or Firm* — JCIPRNET

(57) ABSTRACT

A semiconductor structure includes a substrate, a first support layer, and multiple support pillars. The substrate includes a monitoring region. The monitoring region includes a first region and a second region. The first support layer is located in the first region and the second region, and is located above the substrate. The support pillars are located in the second region. The support pillars penetrate the first support layer and are not connected to each other. Each of the support pillars extends toward the substrate.

17 Claims, 12 Drawing Sheets

SEMICONDUCTOR STRUCTURE

BACKGROUND

Technical Field

The disclosure relates to a semiconductor structure and a manufacturing method therefor, and in particular to a semiconductor structure and a manufacturing method therefor, capable of enhancing strength structure strength.

Description of Related Art

In the process of a semiconductor structure, a monitoring region is often provided to monitor the status of semiconductor components. For example, in the process of a semiconductor structure containing a dynamic random access memory (DRAM) device, a corresponding support layer is formed in the monitoring region and the DRAM device. In this way, the thickness of the support layer in the monitoring region may be used to monitor the status in the DRAM device region. However, if the support layer in the monitoring region is cracked, the state in the DRAM device region cannot be effectively monitored. Therefore, the goal of preventing the cracking of the support layer in the monitoring region is an ongoing effort.

SUMMARY

The disclosure proposes a semiconductor structure including a substrate, a first support layer, and multiple support pillars. The substrate includes a monitoring region. The monitoring region includes a first region and a second region. The first support layer is located in the first region and the second region, and is located above the substrate. The support pillars are located in the second region. The support pillars penetrate the first support layer and are not connected to each other. Each of the support pillars extends towards the substrate.

The disclosure proposes a manufacturing method for a semiconductor structure, including the following steps. A substrate is provided. The substrate includes a monitoring region. The monitoring region includes a first region and a second region. A first support layer is formed above the substrate in the first region and the second region. Multiple support pillars are formed in the second region. The support pillars penetrate the first support layer and are not connected to each other. Each of the support pillars extends towards the substrate.

Based on the above, in the semiconductor structure and the manufacturing method therefor proposed in the disclosure, since multiple support pillars penetrate the first support layer in the monitoring region and are not connected to each other, the structural strength of the semiconductor structure may be effectively improved to prevent the first support layer in the monitoring region from cracking.

To make the aforementioned more comprehensible, several accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A to FIG. 1H are cross-sectional views of manufacturing processes of a semiconductor structure according to some embodiments of the disclosure. FIG. 2 is a top view of a semiconductor structure according to some embodiments of the disclosure. In addition, FIG. 1A to FIG. 1H are cross-sectional views along a line I-I' in FIG. 2. FIG. 3A to FIG. 3F are top views of a monitoring region of a semiconductor structure according to some embodiments of the disclosure. In the top view of this embodiment, some components in the cross-sectional view are omitted to clearly illustrate the positional relationship between the components in the top view.

Figure 1A:
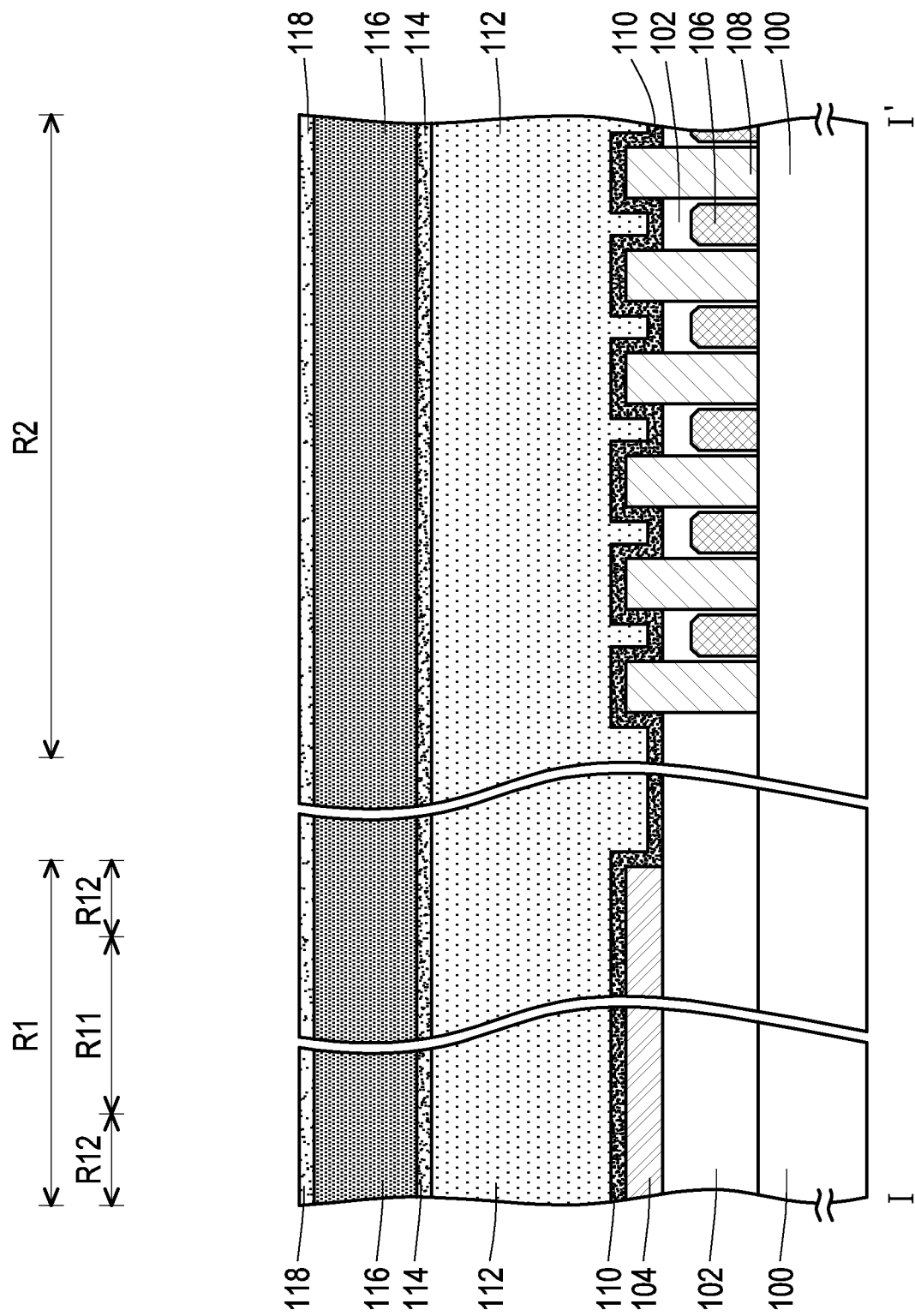
FIG. 1A to FIG. 1H are cross-sectional views of manufacturing processes of a semiconductor structure according to some embodiments of the disclosure.
Figure 2:
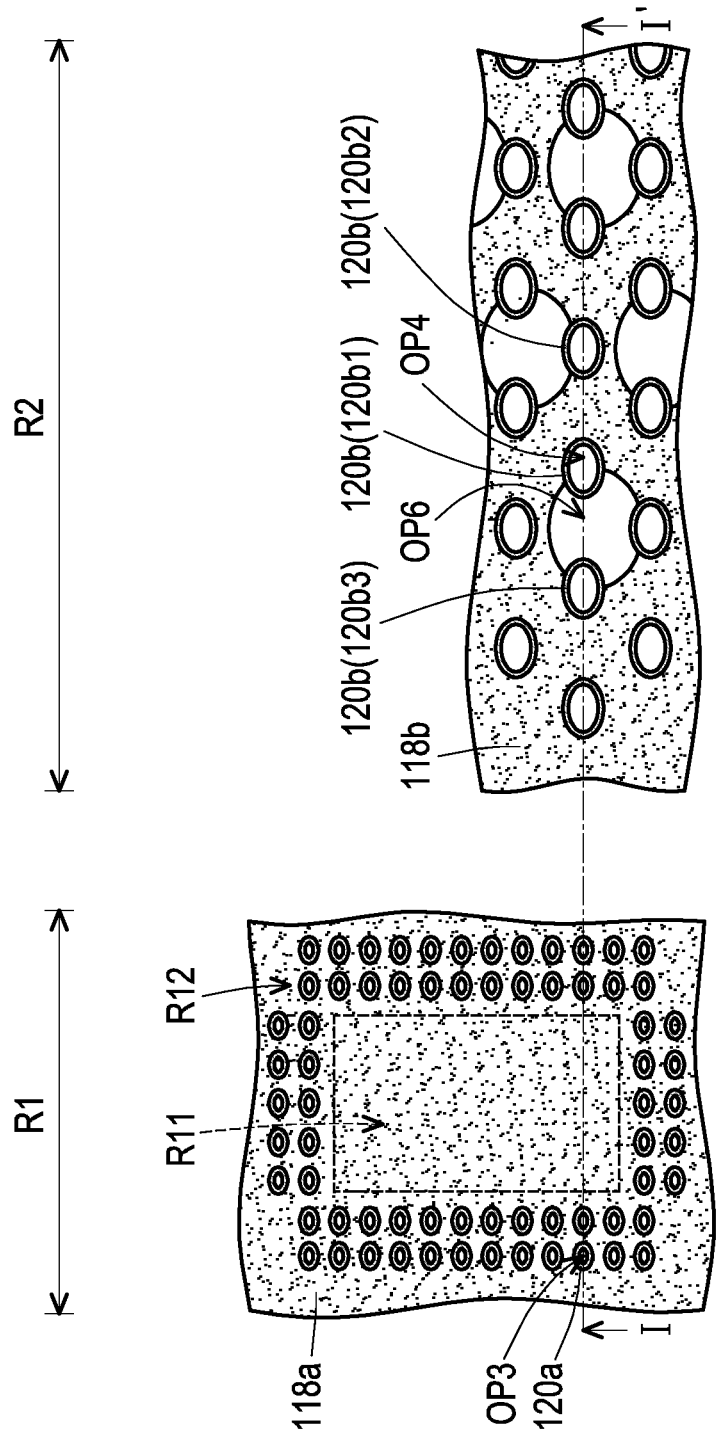
FIG. 2 is a top view of a semiconductor structure according to some embodiments of the disclosure.

Referring to FIG. 1A and FIG. 2, a substrate 100 is provided. The substrate 100 may be a semiconductor substrate, such as a silicon substrate. The substrate 100 may have required components (not shown) such as isolation structures, doped regions, and/or buried word lines, and the description thereof is omitted herein. The substrate 100 includes a monitoring region R1. The monitoring region R1 may be located on a scribe line or in a non-device region of a chip region. The monitoring region R1 includes a first region R11 and a second region R12. In FIG. 2, the first region R11 and the second region R12 are divided by dotted lines, and the second region R12 may surround the first region R11. The first region R11 may be a central region, and the second region R12 may be a peripheral region. The substrate 100 further includes a memory cell region R2. In some embodiments, the memory cell region R2 may be a memory cell region of a DRAM. The memory cell region R2 may be located in a device region of the chip region.

Referring to FIG. 1A, a dielectric layer 102 may be formed on the substrate 100 in the monitoring region R1 and the memory cell region R2. In some embodiments, the dielectric layer 102 may be a multi-layer structure. A material of the dielectric layer 102 is, for example, oxide (e.g., silicon oxide), nitride (e.g., silicon nitride) or a combination thereof. Additionally, a landing layer 104 may be formed on the dielectric layer 102 in the monitoring region R1. A material of the landing layer 104 is, for example, tungsten.

A bit line 106 may be formed on the substrate 100 in the memory cell region R2. The bit line 106 may be located in the dielectric layer 102. A material of the bit line 106 is, for example, a conductive material such as tungsten. In some embodiments, a bit line contact (not shown) may be formed between the bit line 106 and the substrate 100, and the description thereof is omitted herein. Additionally, multiple contacts 108 may be formed on both sides of the bit line 106. The contact 108 may be used to electrically connect to storage nodes (e.g., capacitors) of a DRAM device. The contact 108 may be located in the dielectric layer 102 and may protrude from a top surface of the dielectric layer 102. The contact 108 may be a single-layer structure or a multi-layer structure. A material of the contact 108 is, for example, a conductive material, such as tungsten, doped polysilicon, or a combination thereof. Next, a stop layer 110 may be formed on the dielectric layer 102. The stop layer 110 may cover the landing layer 104 and the contact 108. A material of the stop layer 110 is, for example, nitride (e.g., silicon nitride). A formation method of the stop layer 110 is, for example, chemical vapor deposition.

Then, a dielectric material layer 112, a support material layer 114, a dielectric material layer 116, and a support material layer 118 may be sequentially formed on the stop layer 110. A material of the dielectric material layer 112 is, for example, oxide (e.g., silicon oxide). A material of the support material layer 114 is, for example, nitride (e.g., silicon nitride). A material of the dielectric material layer 116 is, for example, oxide (e.g., silicon oxide). A material of the support material layer 118 is, for example, nitride (e.g., silicon nitride). The dielectric material layer 112, the support material layer 114, the dielectric material layer 116, and the support material layer 118 may be formed by chemical vapor deposition, respectively.

Figure 1B:
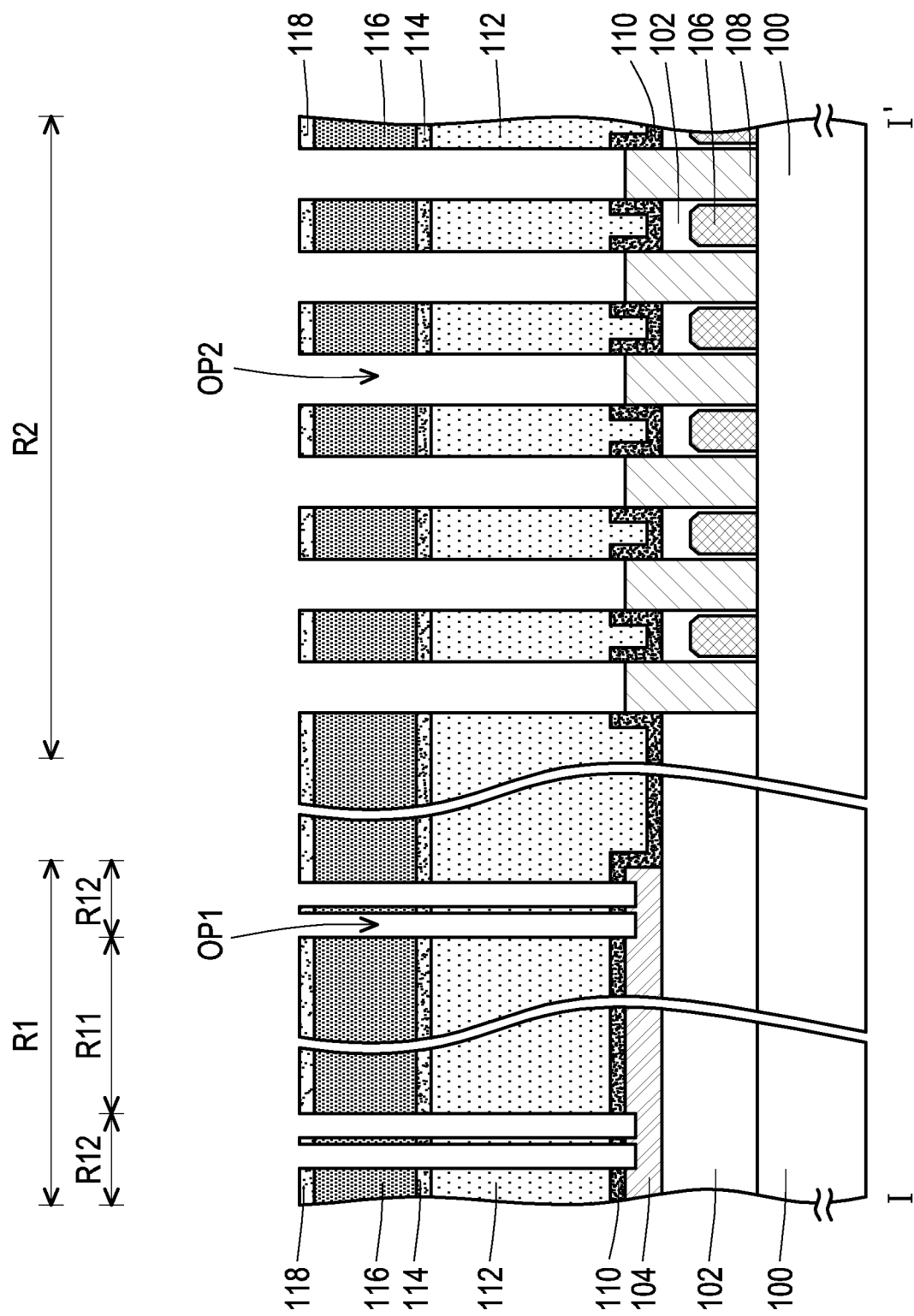

Referring to FIG. 1B, an opening OP1 may be formed in the support material layer 118, the dielectric material layer 116, the support material layer 114, the dielectric material layer 112, and the stop layer 110 in the monitoring region R1, and an opening OP2 may be formed in the support material layer 118, the dielectric material layer 116, the support material layer 114, the dielectric material layer 112, and the stop layer 110 in the memory cell region R2. The opening OP1 may expose the landing layer 104. The opening OP2 may expose the contact 108. The opening OP1 and the opening OP2 are formed, for example, by patterning the support material layer 118, the dielectric material layer 116, the support material layer 114, the dielectric material layer 112, and the stop layer 110 through a photolithography process and an etching process.

Figure 1C:
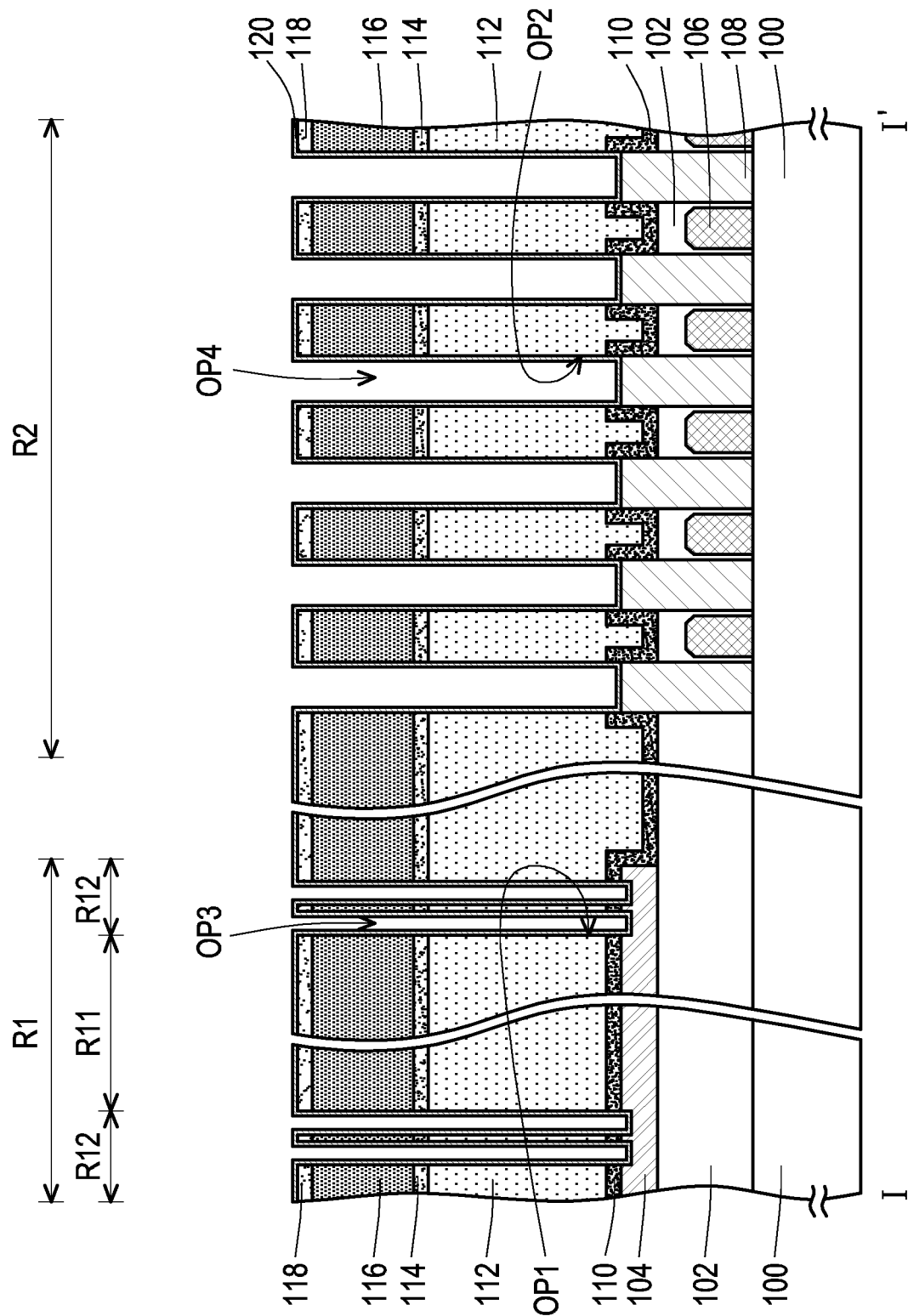

Referring to FIG. 1C, a support material layer 120 may be formed conformally on the support material layer 118 and in the opening OP1 and the opening OP2. The support material layer 120 located in the monitoring region R1 may have an opening OP3, and the support material layer 120 located in the memory cell region R2 may have an opening OP4. A material of the support material layer 120 is, for example, a conductive material such as titanium nitride (TiN). A formation method of the support material layer 120 is, for example, chemical vapor deposition.

Figure 1D:
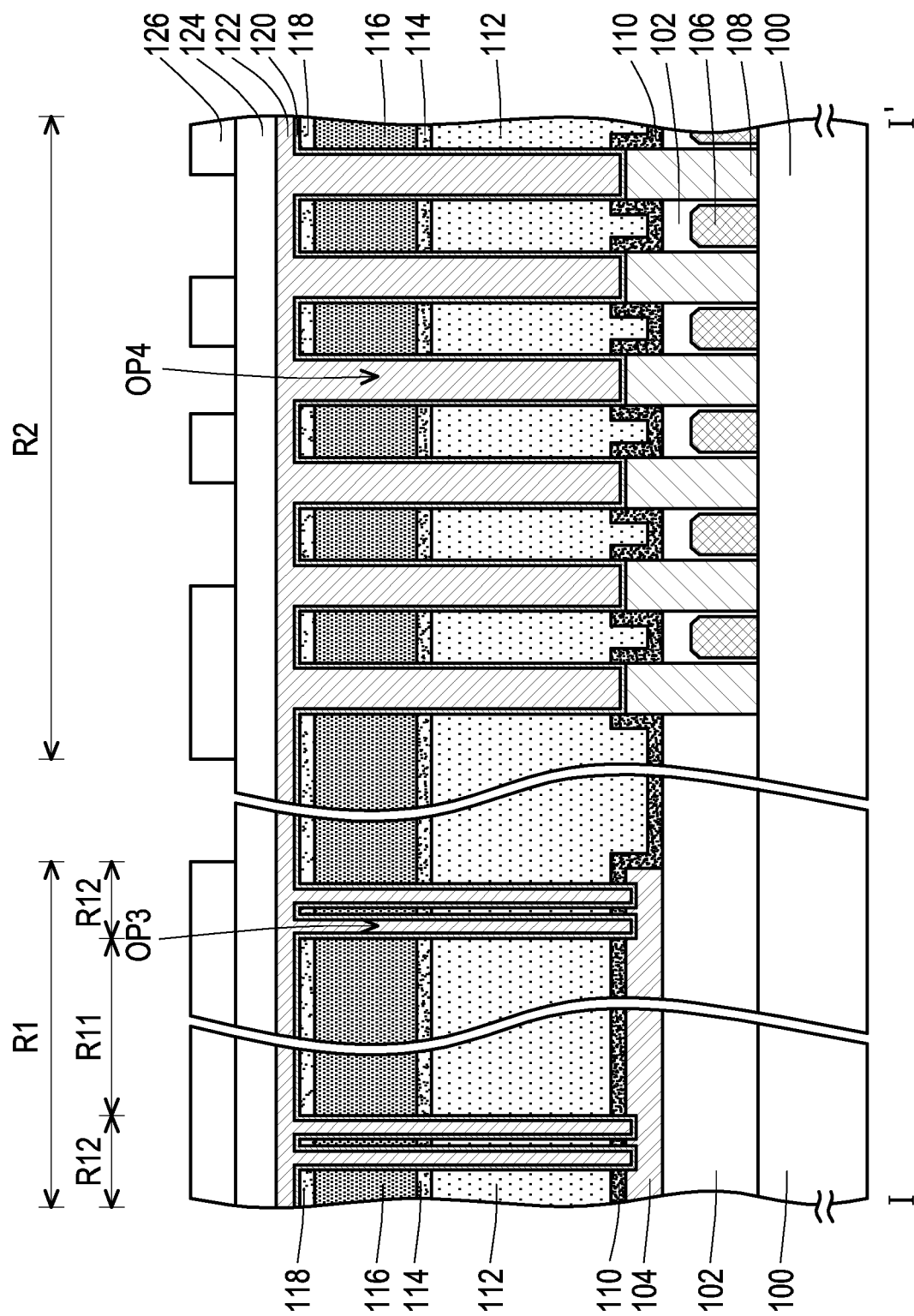

Referring to FIG. 1D, a filling layer 122 filling the opening OP3 and the opening OP4 may be formed. Additionally, the filling layer 122 may be located on the support material layer 120 and above the support material layer 118. A material of the filling layer 122 is, for example, oxide (e.g., silicon oxide). Next, a hard mask layer 124 may be formed on the filling layer 122. The hard mask layer 124 may be a single-layer structure or a multi-layer structure. A material of the hard mask layer 124 is, for example, carbon, silicon oxynitride (SiON) or a combination thereof. A formation method of the filling layer 122 and the hard mask layer 124 is, for example, chemical vapor deposition. Then, a patterned photoresist layer 126 may be formed on the hard mask layer 124. The patterned photoresist layer 126 may be formed by the photolithography process.

Figure 1E:
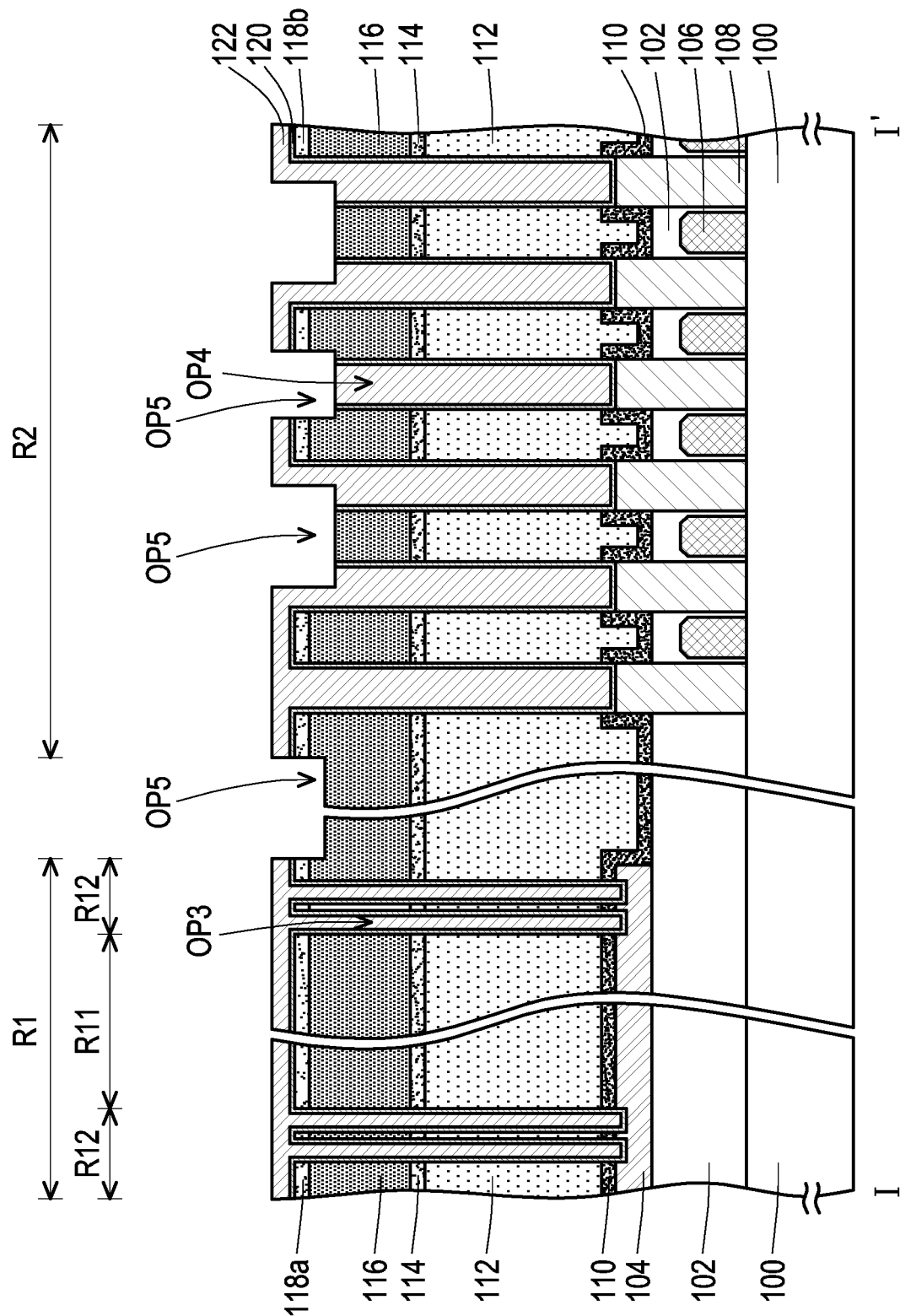

Referring to FIG. 1E, the patterned photoresist layer 126 may be used as a mask to pattern the hard mask layer 124 to form a patterned hard mask layer 124. Next, the patterned photoresist layer 126 may be removed. Then, the patterned hard mask layer 124 is used as a mask, a part of the filling layer 122, a part of the support material layer 120, and a part of the support material layer 118 are removed to form an opening OP5. The opening OP5 may expose a part of the dielectric material layer 116. A method of removing the part of the filling layer 122, the part of the support material layer 120, and the part of the support material layer 118 is, for example, dry etching method. In this way, a support layer 118a may be formed on the substrate 100 in the first region R11 and the second region R12, and a support layer 118b may be formed on the bit line 106 in the memory cell region R2 at the same time. Additionally, a part of the support layer 118b may be located over the bit line 106. In some embodiments, the support layer 118a and the support layer 118b may be separate from each other. Additionally, the patterned hard mask layer 124 may be consumed in the process of forming the opening OP5 or may be removed by an additional etching process. In some embodiments, during the process of forming the opening OP5, a part of the dielectric material layer 116 may be removed.

Figure 1F:
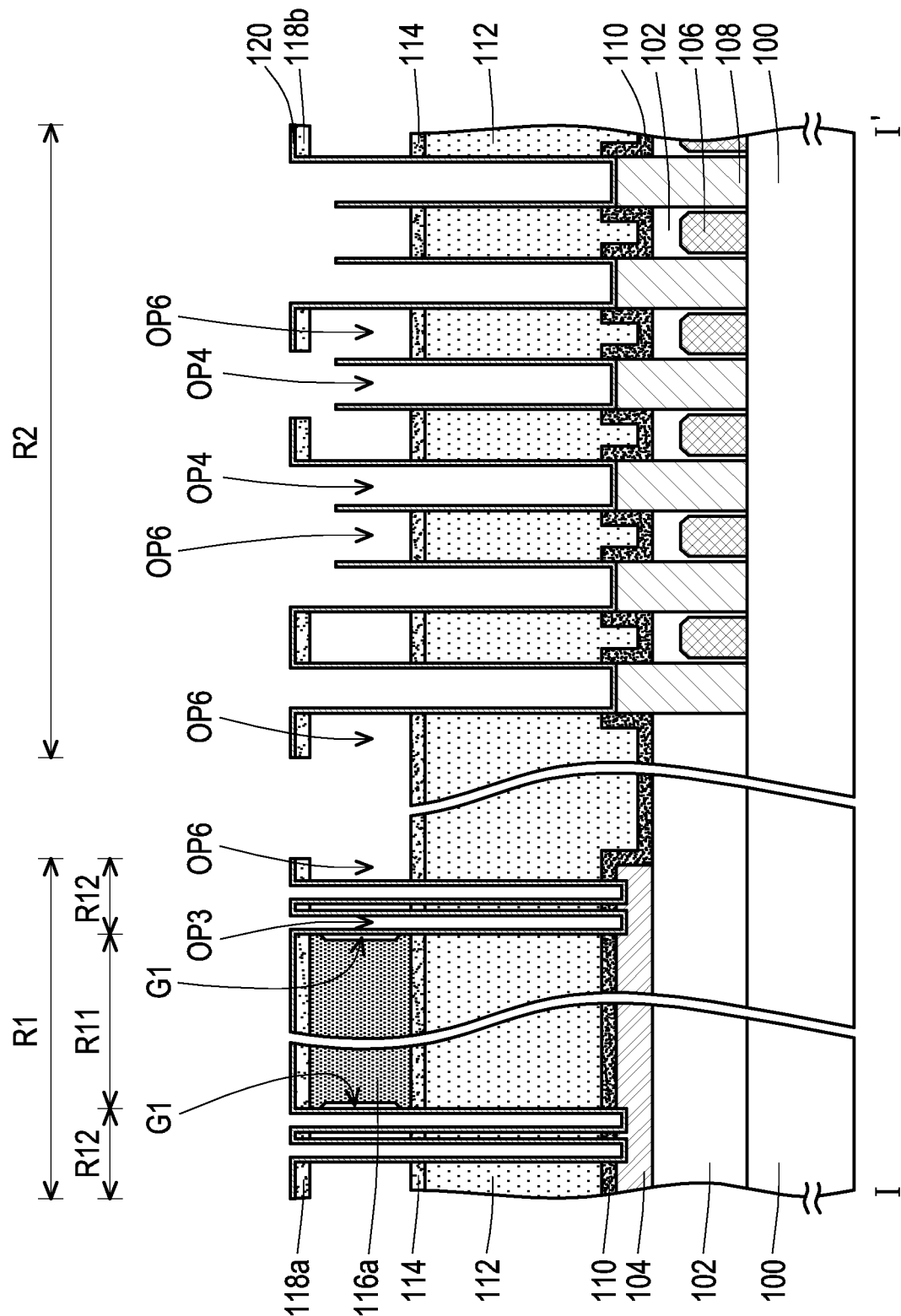

Referring to FIG. 1F, the filling layer 122 and the dielectric material layer 116 in the second region R12 and the memory cell region R2 may be removed by a wet etch process. In this way, a dielectric layer 116a may be formed in the first region R11, and an opening OP6 exposing the support material layer 114 may be formed. The opening OP6 may communicate with the opening OP4. Since the opening OP5 penetrating the support material layer 120 may expose the dielectric material layer 116 (FIG. 1E) located at the edge and inside of the memory cell region R2, the wet etch process may perform lateral etching and top-to-bottom etching on the dielectric material layer 116 in the memory cell region R2. In addition, since the opening OP5 penetrating the support material layer 120 exposes only the dielectric material layer 116 located at the edge of the monitoring region R1, the wet etch process only laterally etches the dielectric material layer 116 in the monitoring region R1. Therefore, the wet etch process may remove the dielectric material layer 116 in the memory cell region R2 at a higher rate than the wet etch process removes the dielectric material layer 116 in the monitoring region R1. In this way, after the dielectric material layer 116 in the memory cell region R2 is completely removed, a part of the dielectric material layer 116 in the monitoring region R1 is not completely removed, and the dielectric layer 116a is formed. In some embodiments, the wet etch process may further remove a part of the dielectric material layer 116 in the first region R11 to form a gap G1. The gap G1 may be located between the dielectric layer 116a and the support material layer 120.

Figure 1G:
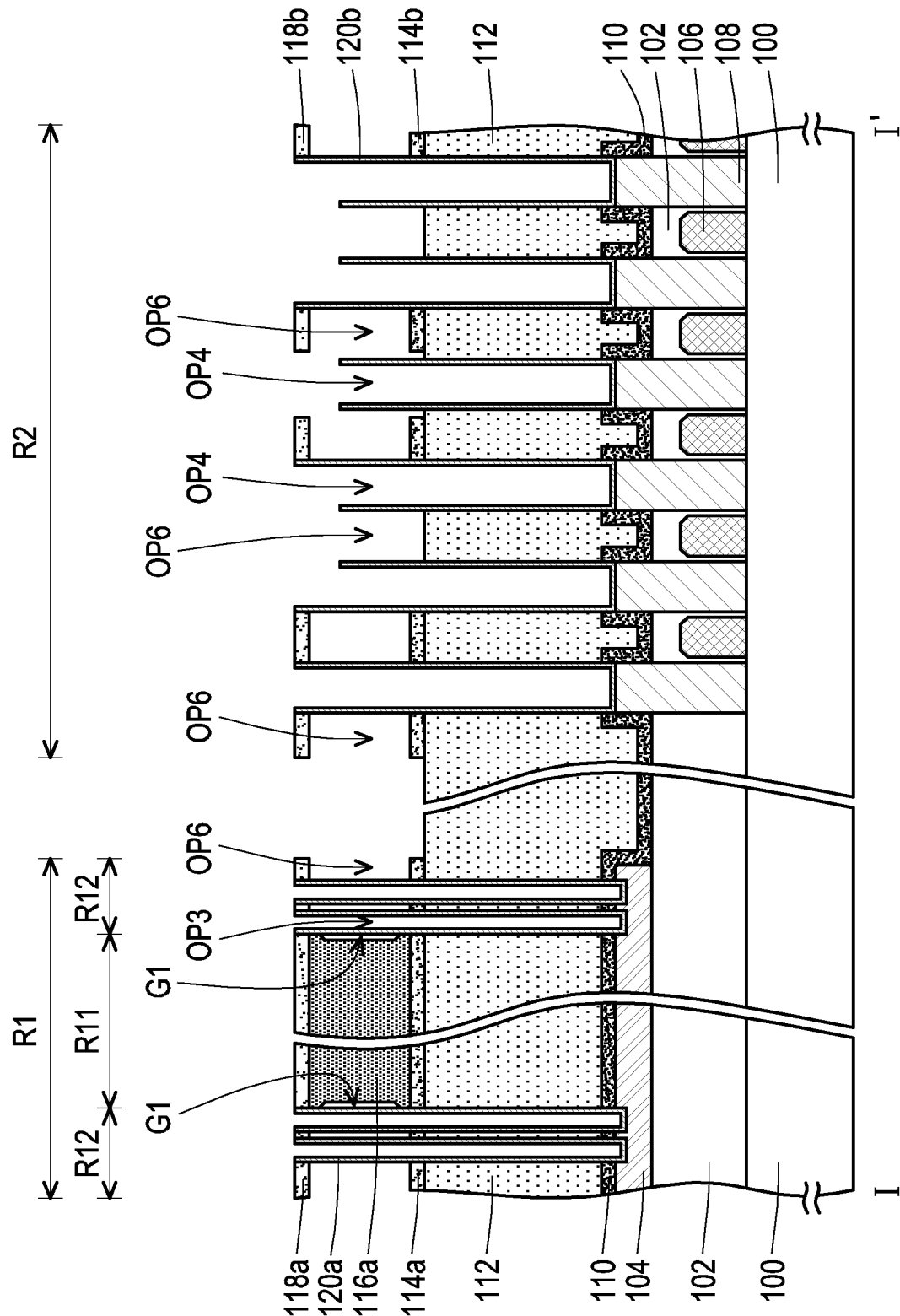

Referring to FIG. 1G, a part of the support material layer 114 may be removed. In this way, a support layer 114a may be formed in the first region R11 and the second region R12, and a support layer 114b may be formed in the memory cell region R2 at the same time. The support layer 114a is located between the support layer 118a and the substrate 100. The support layer 114b is located between the support layer 118b and the bit line 106. Additionally, a part of the support layer 114b may be located over the bit line 106. A method for removing a part of the support material layer 114 is, for example, a dry etch method. Next, the support material layer 120 above the support layer 118a and the support layer 118b may be removed. In this way, multiple support pillars 120a may be formed in the second region R12, and multiple electrodes 120b may be formed on multiple contacts 108 in the memory cell region R2. The multiple support pillars 120a penetrate the support layer 118a. In addition, the multiple support pillars 120a may further penetrate the support layer 114a and the stop layer 110. The multiple support pillars 120a surround the first region R11 and are not connected to each other (FIG. 2). Each of the support pillars 120a extends towards the substrate 100. The electrode 120b may be used as an electrode of a capacitor. The multiple electrodes 120b may penetrate the support layer 118b. In addition, the multiple electrodes 120b may further penetrate the support layer 114b and the stop layer 110. The multiple electrodes 120b may be disconnected from each other (FIG. 2). Each of the electrodes 120b may extend toward the substrate 100. A method for removing the support material layer 120 located above the support layer 118a and the support layer 118b is, for example, performing a dry etch process on the support material layer 120. In some embodiments, a height of the electrode 120b may be adjusted by the dry etch process.

Figure 1H:
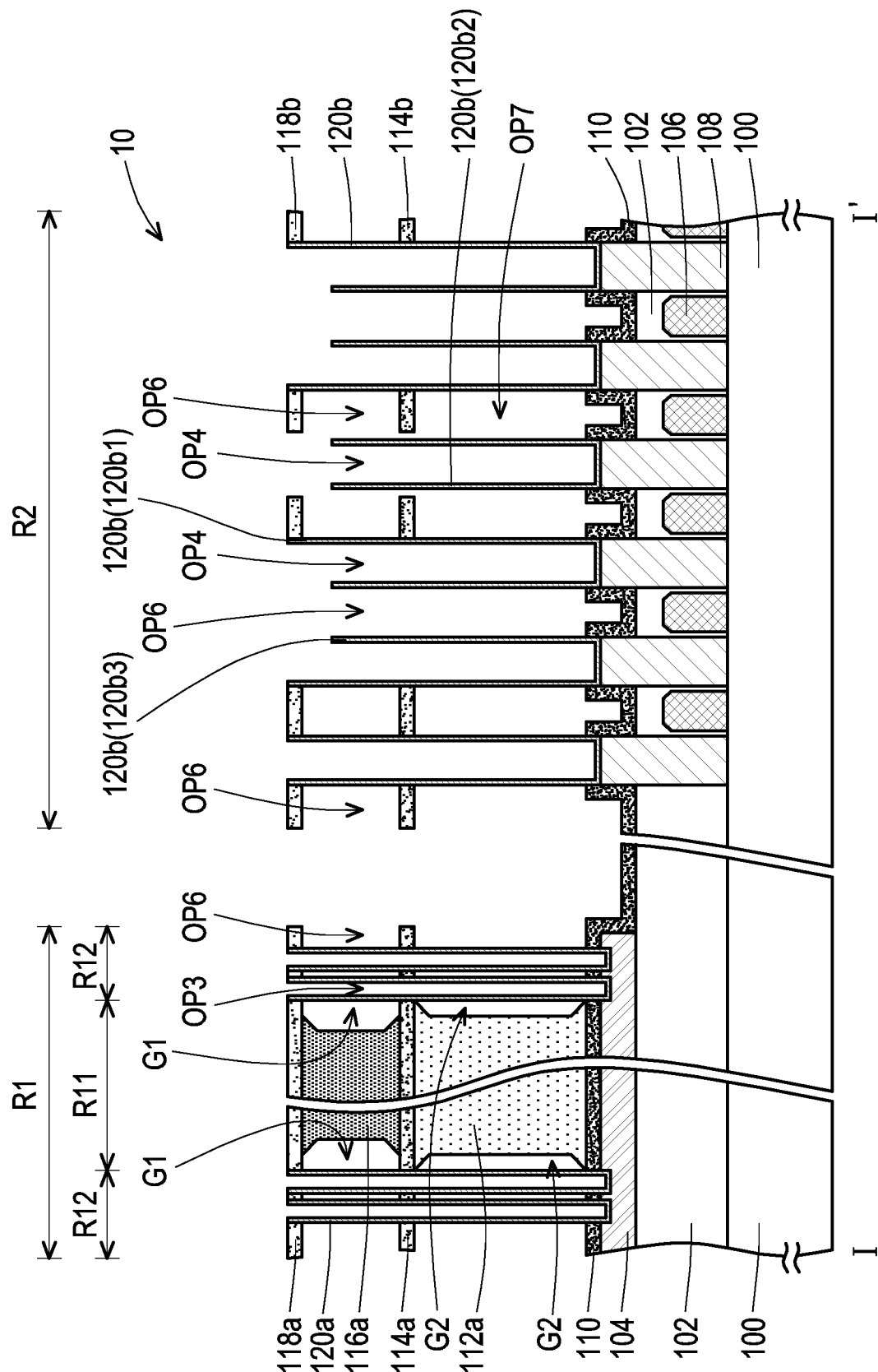

Referring to FIG. 1H, the dielectric material layer 112 in the second region R12 and the memory cell region R2 may be removed by a wet etch process. In this way, a dielectric layer 112a may be formed in the first region R11. An opening OP7 may be formed between the support layer 114b and the stop layer 110, and a part of the opening OP6 may expose the stop layer 110. The opening OP7 may communicate with the opening OP6 and the opening OP4. Since the opening OP6 penetrating the support layer 118b may expose the dielectric material layer 112 located at the edge and inside of the memory cell region R2 (FIG. 1G), the wet etch process may perform lateral etching and top-to-bottom etching on the dielectric material layer 112 in the memory cell region R2. In addition, since the opening OP6 penetrating the support material layer 118a exposes only the dielectric material layer 112 located at the edge of the monitoring region R1, the wet etch process only laterally etches the dielectric material layer 112 in the monitoring region R1. Therefore, the wet etch process may remove the dielectric material layer 112 in the memory cell region R2 at a higher rate than the wet etch process removes the dielectric material layer 112 in the monitoring region R1. In this way, after the dielectric material layer 112 in the memory cell region R2 is completely removed, a part of the dielectric material layer 112 in the monitoring region R1 is not completely removed, and the dielectric layer 112a is formed. In some embodiments, the wet etch process may further remove a part of the dielectric material layer 112 in the first region R11 to form a gap G2. The gap G2 may be located between the dielectric layer 112a and the support pillar 120a. In some embodiments, the wet etch process may further remove a part of the dielectric layer 116a in the first region R11, so that a width of the gap G1 is greater than a width of the gap G2.

After a semiconductor structure 10 is formed, other subsequent processes may also be performed. For example, an insulating layer (not shown) and another electrode (not shown) may be formed on the electrode 120b in the memory cell region R2 to form a capacitor of a DRAM device.

Hereinafter, the semiconductor structure 10 of this embodiment is illustrated by FIG. 1H and FIG. 2. Referring to FIG. 1H and FIG. 2, the semiconductor structure 10 includes a substrate 100, a support layer 118a, and multiple support pillars 120a. In some embodiments, the semiconductor structure 10 may be a semiconductor structure containing DRAM devices. The substrate 100 includes a monitoring region R1. The monitoring region R1 may be located on a scribe line or in a non-device region of a chip region. In some embodiments, the non-device region of the chip region may be a non-functional region. The monitoring region R1 includes a first region R11 and a second region R12, and the second region R12 may surround the first region R11.

The support layer 118a is located in the first region R11 and the second region R12, and is located above the substrate 100. The support layer 118a located in the first region R11 and the support layer 118a located in the second region R12 may be connected to each other (FIG. 2). The support layer 118a may be located between all two adjacent of the support pillars 120a.

Figure 3A:
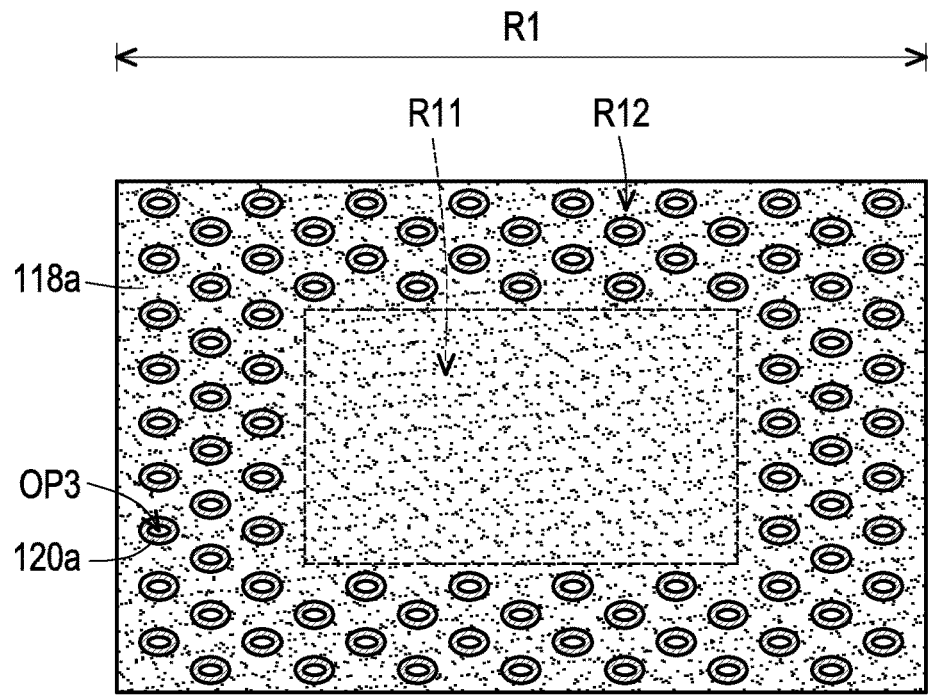
FIG. 3A to FIG. 3F are top views of a monitoring region of a semiconductor structure according to some embodiments of the disclosure.
Figure 3B:
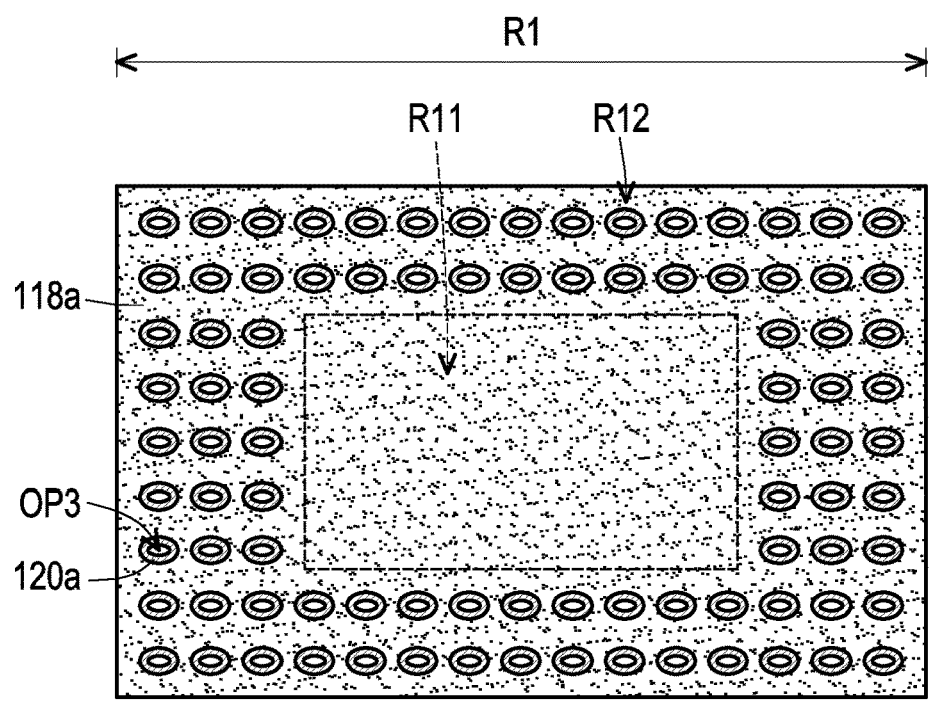
Figure 3C:
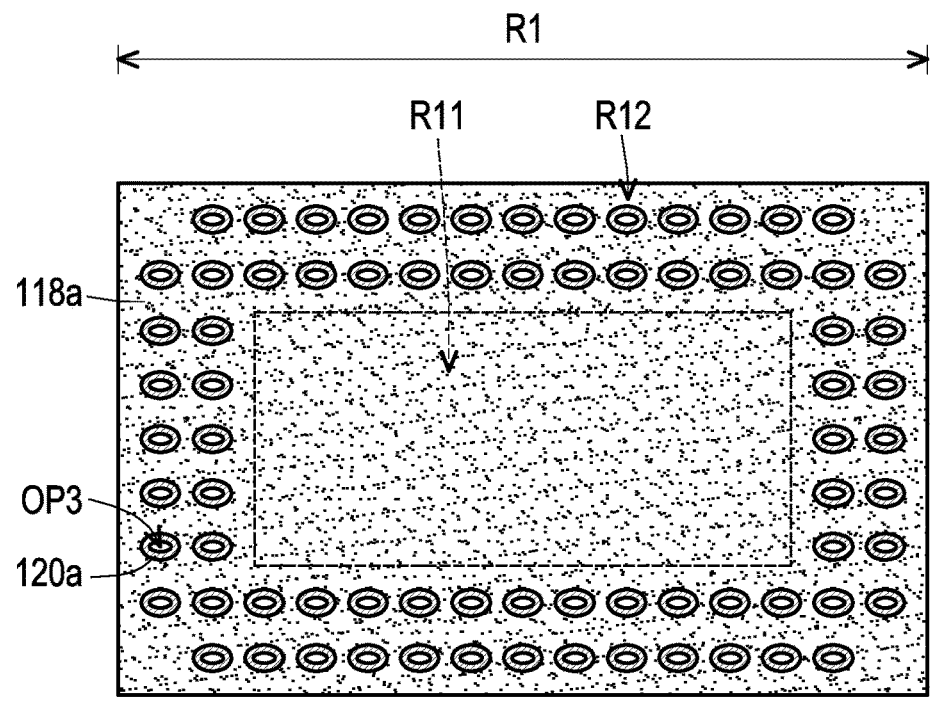
Figure 3D:
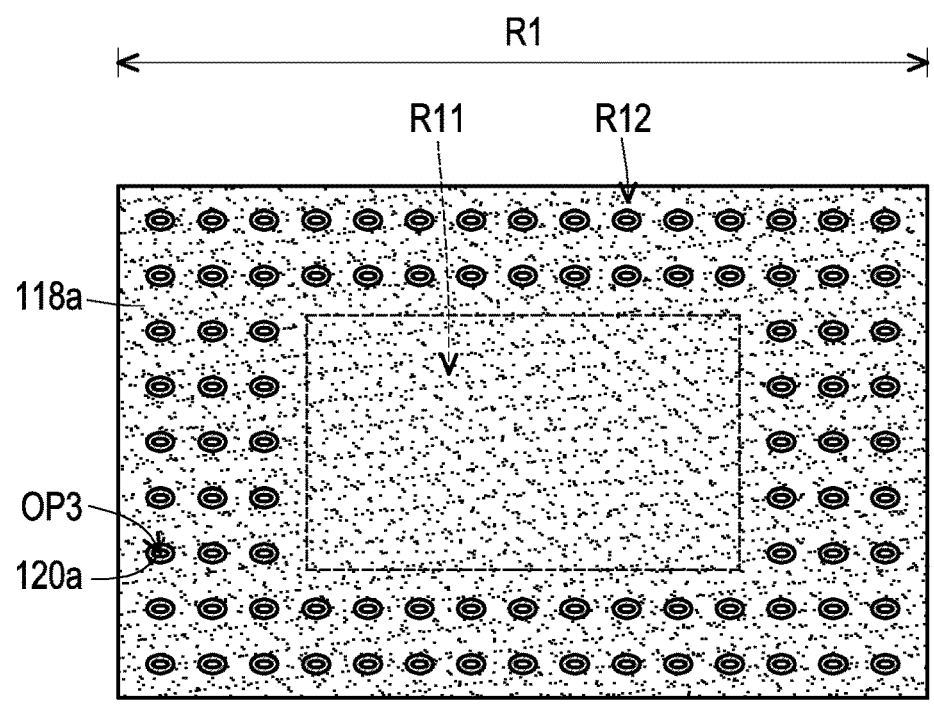
Figure 3E:
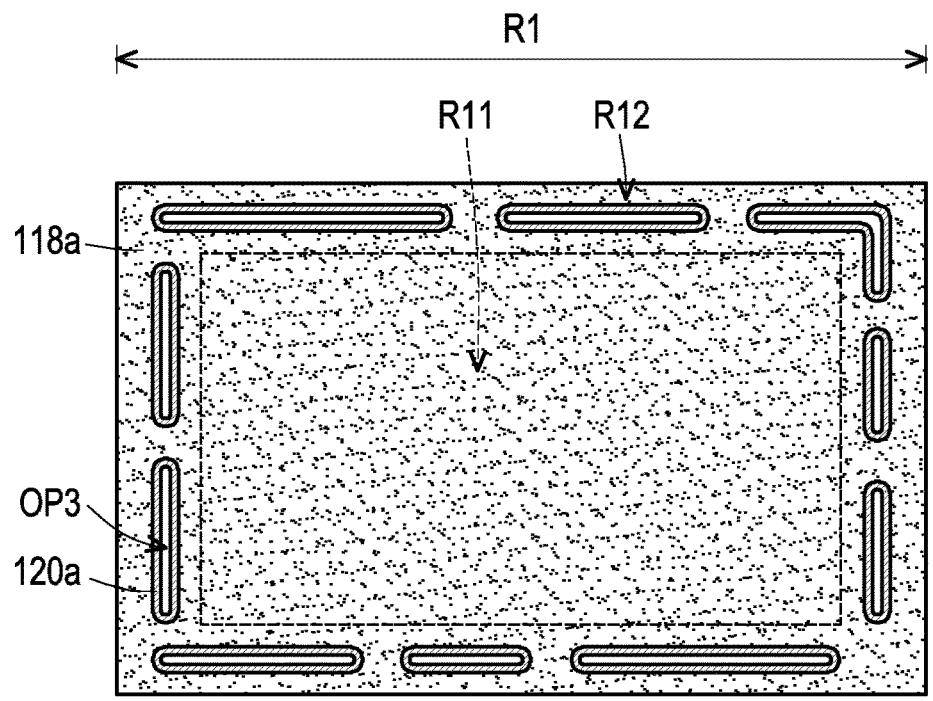
Figure 3F:
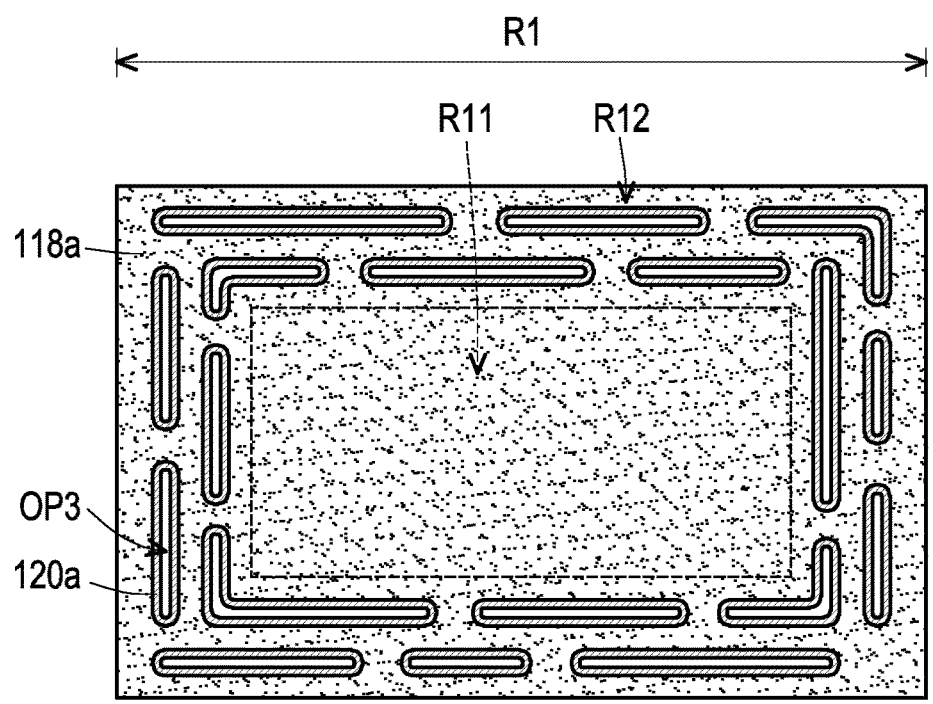

The multiple support pillars 120a are located in the second region R12. In some embodiments, the support pillar 120a is not present in the first region R11. The multiple support pillars 120a penetrate the support layer 118a. The multiple support pillars 120a may directly contact the support layer 118a. The multiple support pillars 120a surround the first region R11 and are not connected to each other. Each of the support pillars 120a extends towards the substrate 100. The support pillar 120a may have an opening OP3, whereby a shape of the support pillar 120a may be a cup shape. In some embodiments, a top-view pattern of the support pillar 120a may be elliptical (FIG. 2 and FIG. 3A to FIG. 3D). In other embodiments, as shown in FIG. 3E and FIG. 3F, a top-view pattern of the support pillar 120a may be strip-shaped. In addition, the arrangement of the multiple support pillars 120a is not limited to the arrangement in FIG. 2. In other embodiments, the arrangement of the multiple support pillars 120a may also be any of the arrangements in FIG. 3A to FIG. 3F. For example, the multiple support pillars 120a may be arranged in a single ring (FIG. 3E) or multiple rings (FIG. 2, FIG. 3A to FIG. 3D, and FIG. 3F). In addition, the support columns 120a in two adjacent rings may be staggered (FIG. 3A) or aligned with each other (FIG. 3B).

The semiconductor structure 10 may further include a support layer 114a and a stop layer 110. The support layer 114a is located in the first region R11 and the second region R12, and is located between the support layer 118a and the substrate 100. In addition, a top-view pattern of the support layer 114a may be similar to a top-view pattern of the support layer 118a in FIG. 2. and the support layer 114a located in the first region R11 and the support layer 114a located in the second region R12 may be connected to each other. The stop layer 110 is located in the first region R11 and the second region R12, and is located between the support layer 114a and the substrate 100. In addition, a top-view pattern of the stop layer 110 may be similar to the top-view pattern of the support layer 118a in FIG. 2, and the stop layer 110 in the first region R11 and the stop layer 110 in the second region R12 may be connected to each other. The multiple support pillars 120a may penetrate the support layer 114a and the stop layer 110. The multiple support pillars 120a may directly contact the support layer 114a and the stop layer 110. Since the multiple support pillars 120a penetrate the support layer 114a in the monitoring region R1, the structural strength of the semiconductor structure 10 may be effectively improved to prevent the support layer 114a in the monitoring region R1 from cracking.

The semiconductor structure 10 may further include a dielectric layer 116a and a dielectric layer 112a. The dielectric layer 116a is located in the first region R11, and is located between the support layer 118a and the support layer 114a. The dielectric layer 112a is located in the first region R11, and is located between the support layer 114a and the stop layer 110. In some embodiments, the dielectric layer 116a and the dielectric layer 112a may not be located in the second region R12. In addition, a gap G1 may exist between the adjacent dielectric layer 116a and the support pillar 120a. A gap G2 may exist between the adjacent dielectric layer 112a and the support pillar 120a. In some embodiments, a width of the gap G1 may be greater than a width of the gap G2.

The semiconductor structure 10 may further include a landing layer 104. The landing layer 104 may be located between the stop layer 110 and the substrate 100. The multiple support pillars 120a may be connected to the landing layer 104. In some embodiments, the support pillar 120a may directly contact the landing layer 104.

In addition, the substrate 100 may further include a memory cell region R2. In some embodiments, the memory cell region R2 may be a memory cell region of a DRAM. The memory cell region R2 may be located in the device region of a chip region. The semiconductor structure may further include a bit line 106, multiple contacts 108, a support layer 118b, and multiple electrodes 120b located in the memory cell region R2. The bit line 106 is located on the substrate 100. The multiple contacts 108 are located on both sides of the bit line 106. A part of the support layer 118b may be located above the bit line 106. The support layer 118b may be located between two adjacent electrodes 120b (e.g., an electrode 120b1 and an electrode 120b2), and the support layer 118b may not be located between other two adjacent electrodes 120b (e.g., the electrode 120b1 and an electrode 120b3). The multiple electrodes 120b are located on the multiple contacts 108. The multiple electrodes 120b may penetrate the support layer 118b. The multiple electrodes 120b may be disconnected from each other (FIG. 2). Each of the electrodes 120b may extend toward the substrate 100. The electrode 120b may have an opening OP4, whereby a shape of the electrode 120b may be a cup shape. In some embodiments, a top-view pattern of the electrode 120b may be elliptical (FIG. 2).

The semiconductor structure 10 may further include a support layer 114b located in the memory cell region R2. A part of the support layer 114b may be located between the support layer 118b and the bit line 106. The support layer 114b may be located between two adjacent electrodes 120b (e.g., the electrode 120b1 and the electrode 120b2), and the support layer 114b may not be located between other two adjacent electrodes 120b (e.g., the electrode 120b1 and the electrode 120b3). The stop layer 110 may further be located in the memory cell region R2. A part of the stop layer 110 may be located between the support layer 114b and the bit line 106. The multiple electrodes 120b may penetrate the support layer 114b and the stop layer 110. The electrode 120b may be electrically connected to the contact 108. In some embodiments, in the memory cell region R2, the support layer 118b and the support layer 114b may not be provided over a part of the stop layer 110.

The semiconductor structure 10 may further include a dielectric layer 102. The dielectric layer 102 is located on the substrate 100. The landing layer 104 and a part of the stop layer 110 may be located on the dielectric layer 102. The bit line 106 may be located in the dielectric layer 102. The contact 108 may be located in the dielectric layer 102 and may protrude from a top surface of the dielectric layer 102.

Based on the above embodiments, in the semiconductor structure 10 and the manufacturing method therefor, since multiple support pillars 120a penetrate the support layer 118a in the monitoring region R1 and are not connected to each other, the structural strength of the semiconductor structure 10 may be effectively improved to prevent the support layer 118a in the monitoring region R1 from cracking.

It will be apparent to those skilled in the art that various modifications and variations can be made to the disclosed without departing from the scope or spirit of the disclosure. In view of the foregoing, it is intended that the disclosure covers modifications and variations provided that they fall within the scope of the following claims and their equivalents.

What is claimed is:

1. A semiconductor structure comprising:
   a substrate comprising a monitoring region, wherein the monitoring region comprise a first region and a second region;
   a first support layer located in the first region and the second region, and located above the substrate, wherein an area of the first support layer located in the first region is equal to an area of the first region; and
   a plurality of support pillars located in the second region, wherein the support pillars penetrate the first support layer and are not connected to each other, each of the support pillars extends in a direction toward the substrate, the support pillars in the second region are arranged in at least one ring, and the first region is located inside the at least one ring.

2. The semiconductor structure according to claim 1, wherein the monitoring region is located on a scribe line or in a non-device region of a chip region.

3. The semiconductor structure according to claim 1, wherein the support pillars are not present in the first region.

4. The semiconductor structure according to claim 1, wherein the first support layer located in the first region and the first support layer located in the second region are connected to each other.

5. The semiconductor structure according to claim 1, wherein the second region surrounds the first region.

6. The semiconductor structure according to claim 1, wherein a shape of each of the support pillars comprises a cup shape.

7. The semiconductor structure according to claim 1 further comprising:
   a second support layer located in the first region and the second region, and located between the first support layer and the substrate; and
   a stop layer located in the first region and the second region, and located between the second support layer and the substrate, wherein
      the support pillars penetrate the second support layer and the stop layer.

8. The semiconductor structure according to claim 7, wherein
   the second support layer located in the first region and the second support layer located in the second region are connected to each other, and
   the stop layer located in the first region and the stop layer located in the second region are connected to each other.

9. The semiconductor structure according to claim 7 further comprising:
   a first dielectric layer located in the first region and located between the first support layer and the second support layer; and
   a second dielectric layer located in the first region and located between the second support layer and the stop layer.

10. The semiconductor structure according to claim 9, wherein the first dielectric layer and the second dielectric layer are not located in the second region.

11. The semiconductor structure according to claim 9, wherein
   a first gap exists between the first dielectric layer and a support pillar of the support pillars adjacent to the first dielectric layer, the first gap is in direct contact with the first dielectric layer and the support pillar of the support pillars adjacent to the first dielectric layer, a second gap exists between the second dielectric layer and a support pillar of the support pillars adjacent to the second dielectric layer, and the second gap is in direct contact with the second dielectric layer and the support pillar of the support pillars adjacent to the second dielectric layer.

12. The semiconductor structure according to claim 11, wherein a width of the first gap is greater than a width of the second gap.

13. The semiconductor structure according to claim 1, wherein the substrate further comprises a memory cell region, and the semiconductor structure further comprises:

a bit line located on the substrate in the memory cell region;

a plurality of contacts located in the memory cell region, and located on both sides of the bit line;

a second support layer located in the memory cell region, wherein a part of the second support layer is located above the bit line;

a plurality of electrodes located in the memory cell region, and located on the contacts, wherein the electrodes penetrate the second support layer, the electrodes are not connected to each other, and each one of the electrodes extends toward the substrate;

a third support layer located in the memory cell region, wherein a part of the third support layer is located between the second support layer and the bit line; and a stop layer located in the memory cell region, wherein a part of the stop layer is located between the third support layer and the bit line, wherein the electrodes penetrate the third support layer and the stop layer.

14. The semiconductor structure according to claim 13, wherein the second support layer is located between two adjacent of the electrodes, and the second support layer is not located between other two adjacent of the electrodes.

15. The semiconductor structure according to claim 1, wherein the first support layer is located between all two adjacent of the support pillars.

16. The semiconductor structure according to claim 1, wherein the support pillars directly contact the first support layer.

17. The semiconductor structure according to claim 1 further comprising:

a landing layer located between the first support layer and the substrate, wherein the support pillars are connected to the landing layer.

* * * * *